Aug. 10, 1965 D. J. GARIBOTTI 3,200,298

MULTILAYER CERAMIC CIRCUITRY

Filed May 27, 1963 3 Sheets-Sheet 1

INVENTOR
DOMENICK J. GARIBOTTI
BY Roger A. Van Kirk
ATTORNEY

INVENTOR
DOMENICK J. GARIBOTTI
BY Roy A. Van Kirk
ATTORNEY

INVENTOR
DOMENICK J. GARIBOTTI
BY Roger A. Van Lieh
ATTORNEY

United States Patent Office 3,200,298
Patented Aug. 10, 1965

3,200,298
MULTILAYER CERAMIC CIRCUITRY

Domenick J. Garibotti, Longmeadow, Mass., assignor to United Aircraft Corporation, East Hartford, Conn., a corporation of Delaware Filed May 27, 1963, Ser. No. 283,506
1 Claim. (Cl. 317—101)

This invention is directed to an electronic subassembly. More particularly, this invention relates to integrated and hybrid semiconductor and thin film circuits utilizing multilayer supercooled liquid or ceramic wafer assemblies as a substrate material.

One continuous and consistent trend in the history of electronics has been the reduction in the size and weight of the assembly needed for any particular electronic function. The term generally applied to this trend is microminiaturization. In recent years, much progress has been made in the microminiaturization of discrete electronic elements and active devices as well as in the integration of devices into so-called functional or logic blocks. However, these size reductions have brought about severe problems in interconnecting the discrete components and devices and functional blocks. Quite often the volumetric potential of an approach to microminiaturization is limited by this interconnection problem.

It is therefore an object of this invention to overcome the above-stated problem and provide microminiaturized electronic subassemblies having high component packaging density.

It is another object of this invention to provide a multilayer circuit board assembly.

It is also an object of this invention to provide a multilayer ceramic circuit board assembly.

It is a further object of this invention to provide an electronic subassembly employing a plurality of stacked microcircuit wafers.

It is yet another object of this invention to provide an electronic subassembly having an extremely high crossover capability.

It is still another object of this invention to provide an electronic subassembly having high crossover and temperature exposure capabilities and high thermal dissipation characteristics.

These and other objects of this invention are accomplished by providing conductive paths and passive circuit components on the surfaces of a plurality of microcircuit wafers. The wafers are then stacked, an insulating medium provided between the surfaces having conductive paths thereon and vertical feedthroughs are fabricated to provide interconnection between the circuits on the surfaces of the individual wafers. If, as is the usual situation, microminiaturized components or functional electronic blocks of the integrated and hybrid variety are necessary to enable the circuit to perform the desired function, these devices may be brazed or otherwise attached to the exposed surfaces of the end boards of the stack and intra or inter connected by the conductive paths and vertical feedthroughs.

This invention may be better understood and its numerous advantages will become apparent to those skilled in the art by reference to the accompanying drawing wherein like reference numerals refer to like elements in the various figures and in which.

Figure 1:
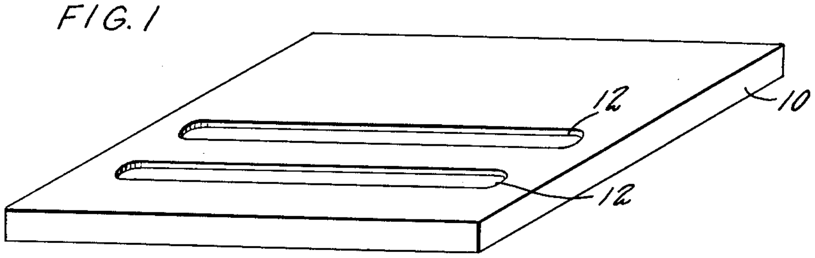
FIGURE 1 depicts a microcircuit wafer which is to be used in the fabrication of the subassembly that comprises this invention.

Referring now to FIGURE 1, there is shown a typical supercooled liquid or ceramic substrate wafer 10 which will form one of a plurality of circuit boards used in each of the multilayer structures produced in accordance with this invention. The term supercooled liquid, as used herein, refers to that group of compositions commonly known as the glasses. In the prior art, there was an attempt to develop multilayer circuit board assemblies utilizing polymeric boards with copper network laminates joined to their surfaces. These prior art multilayer structures most commonly employ epoxy resin circuit boards which have the inherent disadvantages of a relatively low limit of upper service temperature and poor heat transfer characteristics. Also, while individual circuit devices may be soldered to the terminals on these polymeric boards, it is virtually impossible to weld them thereto without exceeding the upper service temperature limits. As is commonly known, soldering is an unacceptable technique for many applications today because of the limitation, due to the size of the soldering tools, it places on circuit component packaging density. Dip soldering does not answer this problem since the solder will not drain off between the leads of closely spaced individual circuit devices and also since dip soldering exposes the individual circuit devices, and particularly semiconductors, to the danger of thermal damage. Further, solder joints are generally considered unreliable due to the inherent possibility that cold solder joints will result thereby causing circuit rejection or failure. These cold solder joints cannot be inspected out during manufacturing. Thus, to overcome the foregoing inherent deficiencies of polymeric circuit boards, this invention utilizes microcircuit wafers of the type shown n FIGURE 1. Glasses and ceramics may be used for the wafers in multilayer structures produced in accordance with this invention. Quartz, sapphire, forsterite, zirconia, alumina and beryllia have been found to be especially suitable wafer materials. It is desirable to use the foregoing materials, and particularly the ceramics, for the circuit boards since these materials provide excellent electrical isolation, low dielectric loss, mechanical strength and stability, and particularly because they have both superior heat transfer characteristics and higher service temperature limits when compared to the polymeric board materials. Two ceramics, beryllia (BeO) and alumina ($Al_2O_3$), have been found to be most desirable for use as substrate wafers in the fabrication of multilayer structures. Because of its inherent high thermal conductivity, beryllia is best suited for applications where high thermal loads are anticipated such as in servoamplifiers. Alumina is of interest where extreme thermal loads are not expected since it is easier to handle from a fabrication standpoint. The wafer 10 shown in FIGURE 1 may typically have dimensions of .02 x 1.25 x 1.25 inches and will be molded with a pair of grooves 12 in one surface thereof. Grooves 12 are of such size that they will accept microcomponents and functional electronic blocks. The use of grooved wafers such as those shown, which are commercially available, enhances the structural integrity of the subassembly.

Figure 2:
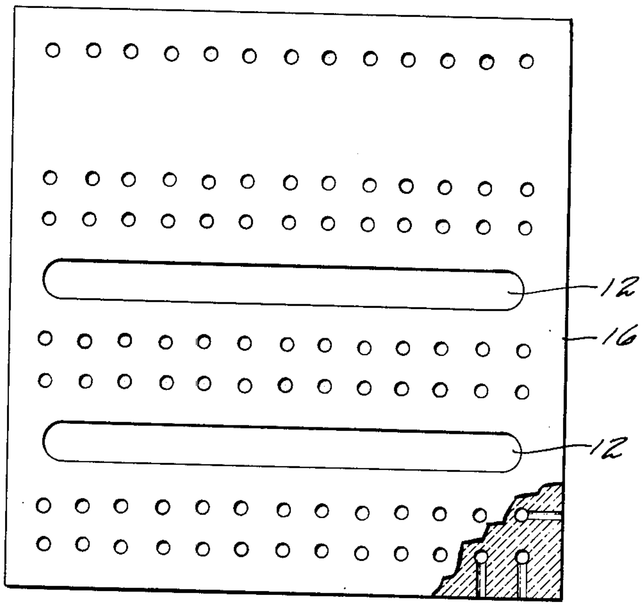
FIGURES 2 through 8 illustrate the various steps in the fabrication of the microminiaturized electronic subassembly of this invention.
Figure 3:
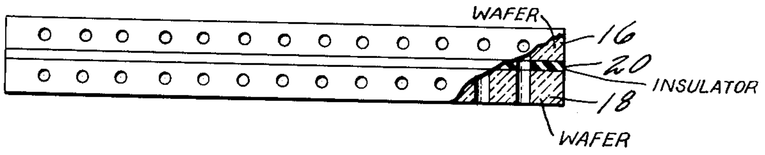

The results of a first step in the fabrication of a multilayer assembly in accordance with this invention is depicted in FIGURES 2 and 3. In these figures, a pair of ceramic wafers 16 and 18 have been fixtured for the production of the hole array therein. These holes, which typically are on a 25 mil grid, will be later used for the feedthroughs which provide interconnection between the circuits on both sides of both wafers and for connection of the circuit or subcircuit carried by the multilayer assembly into a piece of electronic equipment. As most clearly shown in FIGURE 3, a layer of insulating material 20 is inserted between wafers 16 and 18. Layer 20 may be a third ceramic wafer in a case where relatively inexpensive ceramic materials are available and are being used for circuit boards 16 and 18. It is also possible, although at the expense of volumetric efficiency, to provide insulation by metalizing, in the manner and for the purposes to be discussed below, only one surface of one of two wafers to be stacked and to thereby utilize the wafer having only one metalized surface as the insulating member. In a preferred embodiment of this invention, which is the typical case wherein the ceramic material is relatively expensive and the fabrication cost of the holes is also high, layer 20 will consist of a thin sheet of mica. Ceramic wafers 16 and 18 and layer of insulating material 20 are clamped together prior to the production of the vertical feedthrough hole array. The hole layout in both ceramic wafers and in the insulating layer is then fabricated simultaneously to insure registration. The vertical hole array may be produced by any one of several methods. For example, the holes may be drilled simultaneously through the three layers using a programmed electron beam, by ganged drills, by sand blasting techniques, or by ultrasonic drilling techniques. After fabrication of the vertical hole array, a horizontal hole array may be drilled around the periphery of wafers 16 and 18. The horizontal holes will intercept the outer vertical holes thereby making possible electrical connection between the vertical feedthroughs and the edge of the multilayer assembly. Alternatively, the wafers may be notched so as to provide a groove on one surface between the outer vertical feedthroughs and the edge of the wafer. Pins or tabs of conductive material can then later be positioned in these notches so as to provide electrical connection of the subassembly to the outside world. It should be noted that wafers molded with standard vertical hole patterns have recently become available and thus the foregoing step of hole array production may be substantially eliminated. That is, when wafers having a standard hole array produced therein during their molding are utilized, it becomes necessary only to produce the horizontal holes or notches and the vertical holes in insulating layer 20 when materials such as mica are used therefore. This may be done in the manner described above or, under suitable quality control, the mica may be drilled without jigging with the ceramic wafers.

Figure 4:
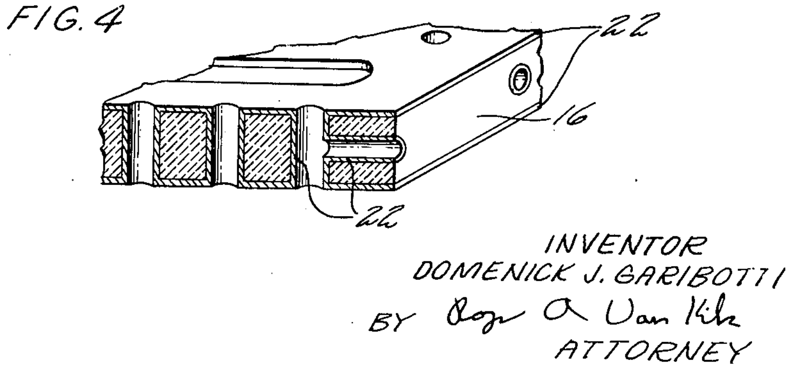

After production of the hole array, the three layer stack is unclamped and the two ceramic wafers 16 and 18 are coated with a metal. In accordance with a preferred embodiment of this invention wherein a separate insulating wafer 20 is utilized, both sides of the ceramic wafers may be metalized by either gas plating or vacuum deposition of a metal or combination of metals thereon. A typical approach is to gas plate the ceramic wafers with chromium followed by electroless plating of gold over the chromium. Another approach is to vacuum deposit chromium on both sides of the wafers followed by vacuum deposition of gold over the chromium. The thin film of gold is plated or deposited over the chromium film to reduce electrical resistivity, increase thermal conductivity, and also to provide a surface to which leads and pin materials may be readily joined by electron beam welding or micro-soldering, brazing, etc. FIGURE 4 is a sectional view of ceramic wafer 16 which a conductive layer 22 of chromium and gold plated thereon. FIGURE 4 also shows some of the holes produced in the manner described above for the vertical and horizontal feedthroughs. It is desirable to produce the hole array before metalizing the ceramic wafers in order that the sides of the holes will also be plated with metallic material as shown. This provides a surface on the inside of the holes to which the conductive feedthrough materials may be readily bonded thereby providing hermetically sealed feedthroughs.

Figure 5:
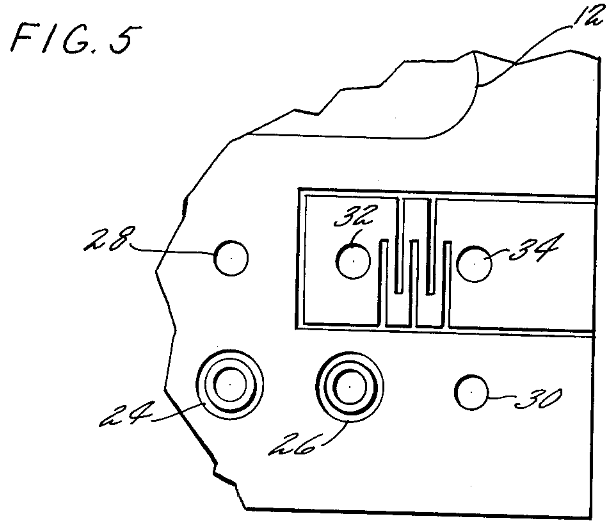

After metalizing, discrete conductive paths and terminal pads must be formed on the ceramic wafers. In accordance with a preferred embodiment of this invention, the conductive paths and thin film passive circuit elements are formed prevalently on the ungrooved side of wafers 16 and 18 which will face the layer of mica 20. This leaves the grooved side of each of the ceramic wafers, which will be exposed, free for the brazing of active and passive circuit components, which may not be fabricated by thin film techniques, thereto. The individual brazed components and devices will, however, be sufficiently spaced apart on the exposed sides of the wafers to permit interconnection of these elements where desired without resort to the vertical conductors. The most usual way of forming conductive paths and passive circuit components on the backs of the ceramic wafers is to selectively etch away portions of the chromium-gold film 22 by causing local evaporation thereof with a highly energized beam which may be deflected across the surface of the wafer in accordance with a predetermined pattern. While this might be done with a device such as a Laser, an intense electron beam has been found to be a particularly efficient tool for such purposes. A device capable of providing the necessary intense electron beam is disclosed in U.S. Patent No. 2,987,610, issued June 6, 1961, to K. H. Steigerwald. The electron beam is a welding or machining tool which has practically no mass but has high kinetic energy because of the extremely high velocity imparted to the electrons. Transfer of this kinetic energy to the lattice electrons of the workpiece generates higher lattice vibrations which cause an increase in the temperature within the impingement area sufficient to accomplish work. Present state of the art electron beam machines of the type shown in the Steigerwald patent, as a result of recently developed refinements in electron optics, can provide a beam focused to produce power densities on the order of 10 billion watts per square inch. Such beams may be focused so as to have diameters of less than .0005 inch at the point of impingement on the work. Impingement of such a highly focused, intense electron beam on the chromium-gold layer on a ceramic wafer will etch away portions of the conductive material by causing local evaporation thereof. Through programming of the beam deflection by means well known in the art, this process quickly, accurately and automatically forms discrete conductive paths separated by areas in which the conductive material has been selectively removed through vaporization thereof. These areas thus become insulating regions. Through proper selection of the beam power density; which is a function of the electron acceleration voltage, the number of electrons in the beam or the beam generator's bias voltage, and the beam diameter or spot size; and the speed at which the beam is deflected across the surface of the coated microcircuit wafer, vaporization of the conductive layer may be achieved without damage to the ceramic substrate. That is, the beam power density and deflection rate will control the depth of penetration of the electrons so that they will penetrate only through the conductive layer. In FIGURE 5, which depicts a portion of a metalized wafer which has been scribed with an electron beam, the lines on the surface of the wafer indicate areas where the conductive material has been removed thereby providing insulating regions. Thus, in FIGURE 5, holes 24 and 26 are isolated from the remainder of conductive layer or film 22 by etching annular isolation moats around the holes. Similarly, holes 28 and 30 are short-circuited by the conductive film. By scribing a very long conductive path between holes 32 and 34, these holes become electrically connected through a thin film resistor. It should be noted that the conductor pattern can also be achieved by photoetching techniques.

Figure 6:
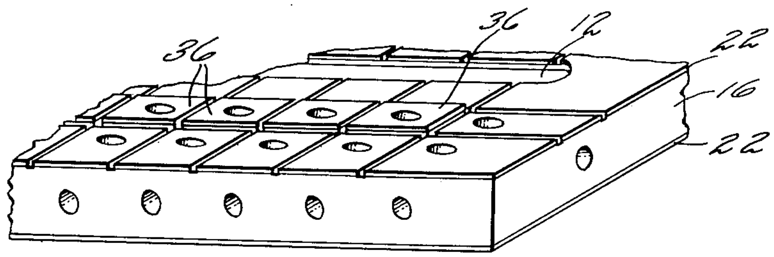

After the conductor patterns have been scribed on the inner faces of the ceramic wafers, the other or exposed surfaces will be scribed to form discrete contact pads and, if desired, interconnecting conductive paths. The scribed contact pads on the surface of wafers 16 and 18 which will, in the final assembly, be exposed are then coated with nickel by an electroless or electroplating process. Electroplating is carried out by making contact to the discrete pads from the metalized underside of the board. By this technique, the result of which is shown in FIGURE 6, it is possible to electroplate only the areas which really require the nickel plating. That is, only the areas to which microcomponent leads will be welded are coated. The purpose of the layer of nickel 36 is to promote the welding of leads or pin terminations to the pads and to afford a thick layer for the dissipation of thermal energy. That is, the nickel may be readily joined to heat sinks to aid in the rapid dissipation of thermal energy from the multilayer package.

Figure 7:
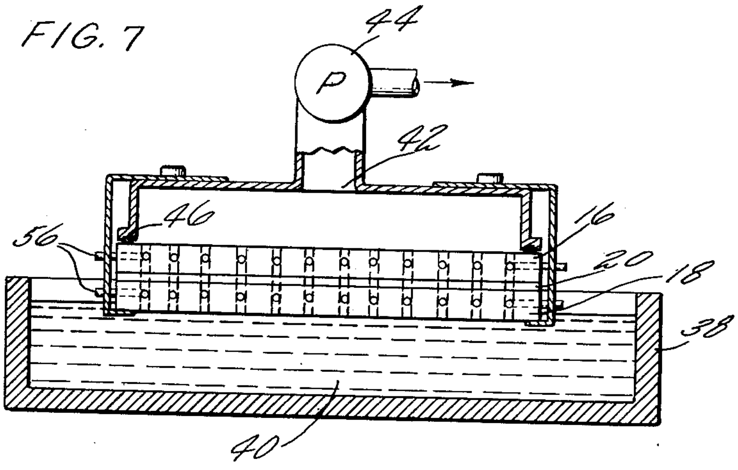

The next step in the production of the multilayer structure is the fabrication of the vertical feedthroughs. This may be accomplished by a variety of methods. FIGURE 7 illustrates one of these methods whereby the vertical feedthroughs can be provided through the entire multilayer assembly at one time. In FIGURE 7 ceramic wafers 16 and 18 with the coated holes and layer of mica 20 are jigged together in such a manner as to line up all of the vertical holes. Next, pins 56 are inserted in desired ones of the horizontal holes. Then, the entire structure is preheated and dipped in a crucible 38 of molten brazing alloy 40. To accomplish the dipping, the structure is held against a nozzle 42 which is connected to a vacuum pump 44. Due to the vacuum, which is maintained across the upper surface of the assembly by pump 44 and the vacuum seal 46, the molten alloy from crucible 38 will rise within the holes due to vacuum action. In an alternate approach, the feedthroughs are fabricated by immersing the jigged multilayer structure in the molten alloy and allowing it to fill the openings by capillary forces. Upon solidification of the alloy in the holes, hermetically sealed, vertical, electrically conductive feedthroughs are provided between all the surfaces of the multilayer assembly. Also, rigid electrical contact is made between the vertical feedthroughs and the horizontal pins. As described above, interconnection is limtied to the desired surfaces by isolating particular feedthroughs by scribing annular moats in the metalized surface on the wafers around the holes. However, interconnection potential is offered to all coated parallel surfaces. Another method of providing the vertical feedthroughs is by inserting a wire or pin within the metalized holes and then melting down the wire or pin with an electron beam. As before, upon solidification of the conductive material in the hole, a conductive path will be provided between all of the parallel surfaces. Still another method of fabricating the vertical feedthroughs is to insert a special expandable alloy in each of the holes. This may be done with suitable devices such as a syringe as used by dentists to pack dental alloys within a cavity. Setting of these dental alloys may be accelerated by slightly elevated temperature treatment. The vertical feedthroughs may also be fabricated by applying a brazing alloy within the metalized holes and firing at a suitable temperature to obtain electrical continuity between all of the parallel surfaces. A large number of alloys may be used for this purpose, the choice depending upon the desired service temperature of the multilayer structure. For a further discussion of these and various other methods of fabricating vertical conductive paths through a layer of insulating material, reference is made to copending application Serial No. 186,467, filed April 10, 1962, now Patent No. 3,178,804 by myself and L. R. Ullery, Jr. as co-inventors.

Figure 8:
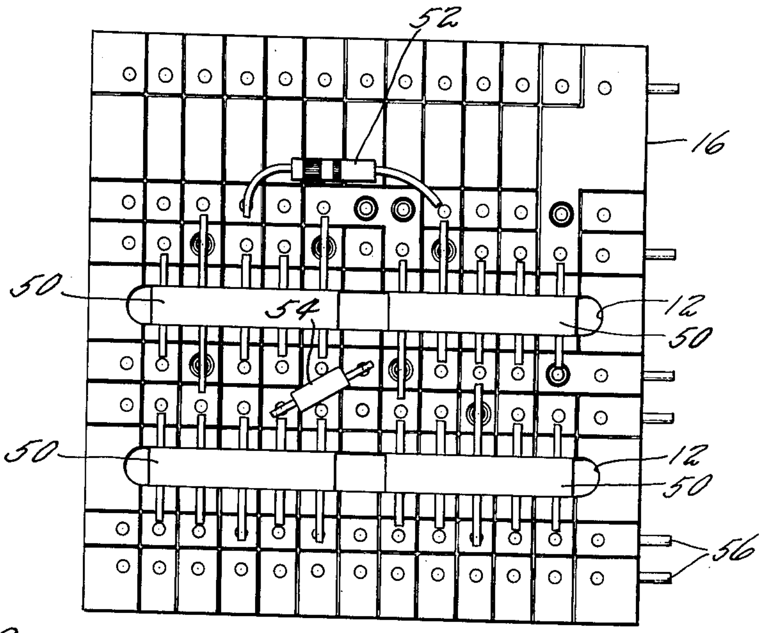

Referring now to FIGURE 8, after the multilayer wafer assembly has been assembled and the vertical feedthroughs fabricated, the leads from individual electronic circuit components and devices, which can not be produced by thin film techniques, and functional electronic blocks are electron beam welded or microsoldered or brazed to the discrete nickel coated terminal pads on the exposed surface of ceramic wafers 16 and 18. In FIGURE 8 these components are represented by four functional electronic blocks 50, a temperature independent resistor 52 and a non-voltage dependent capacitor 54. Since, as indicated above, pins 56 are in electrical contact with the vertical feedthroughs, attachment of the active and passive circuit components to the terminals on wafers 16 and 18 completes the assembly of the structure. Pins 56 may then be used to plug the assembly into an electronic device. If desired, the assembly can now be readily transformed into a hermetically sealed package. This may be facilitated by making the base wafer slightly larger than the other wafers in the stack and then welding a can to the metalized surface around the exposed rim. This technique is generally applicable when active devices are attached to the exposed surface of the top wafer only. Also, to assure that the individual conductor networks not be exposed to the environments, it may be desirable to weld the individual ceramic wafers of the multilayer assembly together. This can be accomplished by fusing the ceramic wafers with an electron beam. However, the most usual manner of providing hermetic encapsulation is by welding or brazing cans around the metalized periphery of the exposed sides of both the bottom and top wafers. It should be noted that unencapsulated semiconductor devices and integrated or hybrid solid circuits may be utilized with this invention thereby realizing a substantial improvement in volumetric efficiency. Under conditions where encapsulated devices are attached to the end boards and thus hermetic encapsulation of the surfaces is not desired, it has been found advantageous to coat the nickel coated pads with a gold film to provide resistance to oxidation.

Figure 9:
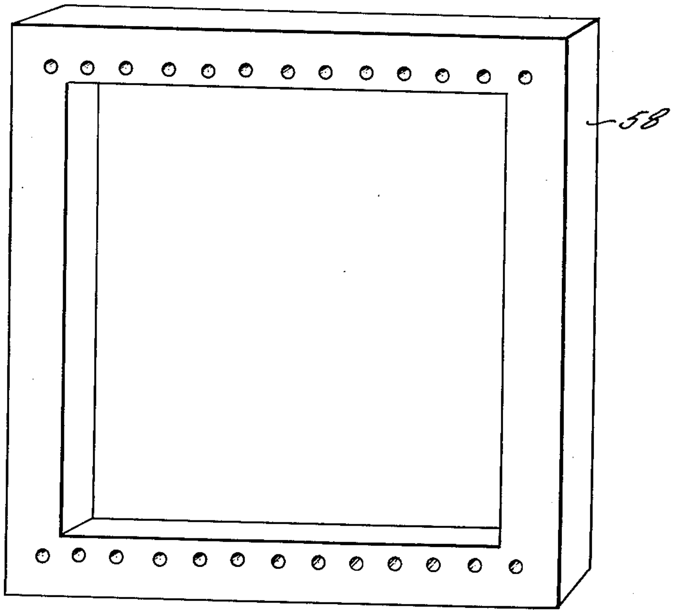
FIGURES 9 and 10 illustrate one manner in which the basic structure or assembly of this invention may be expanded to perform a more complex electronic function.
Figure 10:
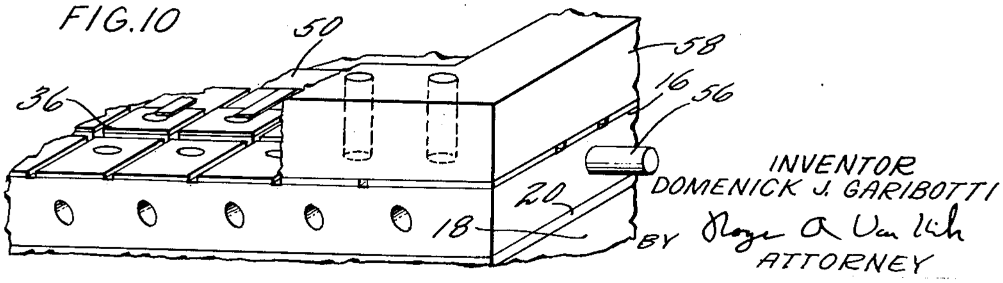

Referring now to FIGURE 9, there is shown means by which additional layers may be added to the multilayer assembly of FIGURE 8 thereby permitting the assembly to perform more complex electronic functions. As shown in FIGURE 9 a ceramic member 58 having the shape of a picture frame may be placed on top of the assembly. Member 58 will, of course, have a plurality of vertical conductive paths extending therethrough. These vertical feedthroughs are in registration with the vertical feedthroughs around the periphery of circuit board 16. As should be obvious, an additional three layer assembly may be attached to the top of member 58. FIGURE 10 depicts member 58 positioned on top of the multilayer assembly consisting of ceramic wafers 16 and 18 and mica separator 20.

While preferred embodiments have been shown and described, various modifications and substitutions may be made without deviating from the scope and spirit of this invention. Thus this invention is described by way of illustration rather than limitation and accordingly it is understood that this invention is to be limited only by the appended claim taken in view of the prior art.

I claim:

An electronic multilayer subassembly comprising:

a pair of ceramic wafers, each having inner and outer surfaces, a first layer of insulating material disposed between said wafers contacting the inner ceramic surfaces of said wafers, the outer ceramic surfaces opposite the inner surfaces being exposed, where at least one of said exposed surfaces has a groove therein, conductive means providing vertical conductive feed through said wafers and insulating layer, conductive terminal pads located on the inner and exposed surfaces in electrical contact with said conductive feed throughs, discrete conductive paths on said inner and exposed surfaces interconnecting selected ones of said terminal pads, means on at least one of the inner surfaces forming passive electrical components and conductor paths selectively interconnecting the components and the terminal pads on said one inner surface, a plurality of electronic devices affixed to the exposed surfaces within said groove, said affixed devices having leads closely adjacent the exposed surface and electrically connected to selected ones of the discrete conductive paths, said ceramic wafers further having horizontal conductive feed throughs spaced along at least one edge of the wafers and extending inwardly therefrom interconnecting selected ones of said vertical feed throughs with said one edge, conductive pins connected within said horizontal feed throughs and extending beyond the edge of the wafer for interconnecting the multilayer assembly into an electronic instrument.

References Cited by the Examiner

UNITED STATES PATENTS

| | | | |
|---|---|---|---|
| 3,042,741 | 7/62 | Cumpston | 174—68.5 |
| 3,075,280 | 1/63 | Jack et al. | 29—155.5 |
| 3,077,511 | 2/63 | Bohrer et al. | 174—68.5 |
| 3,088,191 | 5/63 | Breiling | 29—155.5 |
| 3,102,213 | 8/63 | Bedson et al. | 174—68.5 |

FOREIGN PATENTS

| | | |
|---|---|---|
| 715,207 | 9/54 | Great Britain. |
| 718,811 | 11/54 | Great Britain. |
| 1,256,632 | 2/61 | France. |

OTHER REFERENCES 1,094,827, 12/60, German printed application.

JOHN F. BURNS, *Primary Examiner.*

JOHN P. WILDMAN, DARRELL L. CLAY, *Examiners.*